(12) United States Patent
Dai et al.

(10) Patent No.: US 12,517,439 B2
(45) Date of Patent: Jan. 6, 2026

(54) VACUUM BAKE FOR EUV LITHOGRAPHY

(71) Applicant: Applied Materials, Inc., Santa Clara, CA (US)

(72) Inventors: Huixiong Dai, San Jose, CA (US); Mangesh Ashok Bangar, San Jose, CA (US); Chih-An Hsu, Santa Clara, CA (US); Srinivas D. Nemani, Sunnyvale, CA (US); Dmitry Lubomirsky, Cupertino, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 18/243,129

(22) Filed: Sep. 7, 2023

(65) Prior Publication Data

US 2024/0085810 A1   Mar. 14, 2024

Related U.S. Application Data

(60) Provisional application No. 63/405,317, filed on Sep. 9, 2022.

(51) Int. Cl.
G03F 7/00   (2006.01)
G03F 7/40   (2006.01)

(52) U.S. Cl.
CPC ............ G03F 7/70875 (2013.01); G03F 7/40 (2013.01)

(58) Field of Classification Search
CPC ........... G03F 7/70875; G03F 7/40; G03F 7/38
See application file for complete search history.

(56) References Cited

U.S. PATENT DOCUMENTS

| | | | | |
|---|---|---|---|---|
| 5,815,396 A | * | 9/1998 | Shimamura | H01L 21/67109 700/123 |
| 8,785,821 B2 | * | 7/2014 | Herchen | H01L 21/67109 118/724 |
| 9,425,058 B2 | * | 8/2016 | Kim | H01L 21/0337 |
| 9,829,790 B2 | * | 11/2017 | Buchberger, Jr. | G03F 7/70866 |
| 10,437,153 B2 | * | 10/2019 | Yamada | G03F 7/40 |
| 2011/0242508 A1 | | 10/2011 | Kobayashi | |
| 2023/0161260 A1 | | 5/2023 | Lubomirsky et al. | |

FOREIGN PATENT DOCUMENTS

| | | |
|---|---|---|
| JP | 2000294482 A | 10/2000 |
| JP | 2005072747 A | 3/2005 |
| JP | 2011075683 A | 4/2011 |

OTHER PUBLICATIONS

International Search Report dated Dec. 26, 2023 regarding PCT Application No. PCT/US2023/032141.

\* cited by examiner

*Primary Examiner* — Hung V Nguyen
(74) *Attorney, Agent, or Firm* — Patterson + Sheridan, LLP

(57) ABSTRACT

A method and apparatus for performing post-exposure bake operations is described herein. After exposure of photoresist on a substrate, the substrate is heated during a baking process to facilitate protection of the resist. The baking process is performed in a vacuum environment at sub-atmospheric pressures. After baking at reduced pressure, the substrate is cooled. The cooling process is performed at sub-atmospheric pressures. Further development of the resist is performed at ambient pressures.

20 Claims, 8 Drawing Sheets

VACUUM BAKE FOR EUV LITHOGRAPHY

CROSS-REFERENCE TO RELATED APPLICATIONS

This application claims benefit of U.S. Provisional Application No. 63/405,317, filed on Sep. 9, 2022, the entirety of which is herein incorporated by reference.

BACKGROUND

Field

Embodiments of the present disclosure generally relate to methods and apparatus for semiconductor processing. More specifically, the disclosure is directed towards methods and apparatus for treating a substrate after exposure to radiation.

Description of the Related Art

Integrated circuits have evolved into complex devices that can include millions of components (e.g., transistors, capacitors and resistors) on a single chip. Photolithography is a process that may be used to form components on a chip. Generally, the process of photolithography involves several stages. Initially, a photoresist layer is formed on a substrate. A chemically amplified photoresist typically includes a resist resin and a photoacid generator. The photoacid generator, upon exposure to electromagnetic radiation in a subsequent exposure stage, alters the solubility of the photoresist in the development process. The electromagnetic radiation may be generated by any suitable source, for example, a laser, an electron beam, an ion beam, or other suitable electromagnetic radiation source. The electromagnetic radiation is also selected with any desirable wavelength, for example, 193 nm or other suitable wavelength.

In the exposure stage, a photomask or reticle is used to selectively expose certain regions of the substrate to electromagnetic radiation. Other exposure methods include maskless exposure methods or the like. Exposure to light decomposes the photo acid generator, which generates acid and results in a latent acid image in the resist resin. After exposure, the substrate is heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, is developed and rinsed to create a patterned mask. Depending on the type of photoresist used, regions of the substrate that were exposed to electromagnetic radiation are either resistant to removal or more prone to removal. After development and rinsing, the pattern of the mask is transferred to the substrate using a wet or dry etch process.

The evolution of chip design continually pursues faster circuitry and greater circuit density. The demand for greater circuit density typically utilizes a reduction in the dimensions of the integrated circuit components. As the dimensions of the integrated circuit components are reduced, more elements are able to be placed in a given area on a semiconductor integrated circuit. Accordingly, lithography processes transfer even smaller features onto a substrate, and lithography does so precisely, accurately, and without damage to meet advanced chip design specifications. In order to precisely and accurately transfer features onto a substrate, high resolution lithography utilizes a light source that provides radiation at small wavelengths. Small wavelengths help to reduce the minimum printable size on a substrate. However, small wavelength lithography suffers from problems, such as low throughput, increased line edge roughness, and/or decreased resist sensitivity. Moreover, there are difficulties in decreasing the printing size on the substrate and maintaining uniform critical dimension of patterned features using current photoresist materials and bake processes.

Therefore, there is a need for improved methods for resist patterning on a substrate.

SUMMARY

In one embodiment, a substrate processing method is provided. The method includes exposing photoresist disposed on a substrate to electromagnetic energy, transferring the substrate to a process chamber and baking the substrate at sub-atmospheric pressure, and transferring the substrate from the process chamber to a chill plate to cool the substrate.

In another embodiment, a substrate processing method, includes exposing a chemically amplified photoresist disposed on a substrate to a lithographic exposure process at sub-atmospheric pressure, transferring the substrate to a process chamber having a process volume, baking the substrate at sub-atmospheric pressure in the process volume, and cooling the substrate in the process volume of the process chamber at the sub-atmospheric pressure.

In another embodiment, a substrate processing method includes exposing a chemically amplified photoresist disposed on a substrate to a lithographic exposure process at sub-atmospheric pressure, transferring the substrate to a process chamber having a process volume, baking the substrate at sub-atmospheric pressure in the process volume, cooling the substrate to below 30° C. in the process volume of the process chamber at a pressure below 100 Torr, and transferring the substrate from the process chamber to a developer and developing the photoresist.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

DETAILED DESCRIPTION

Figure 1:
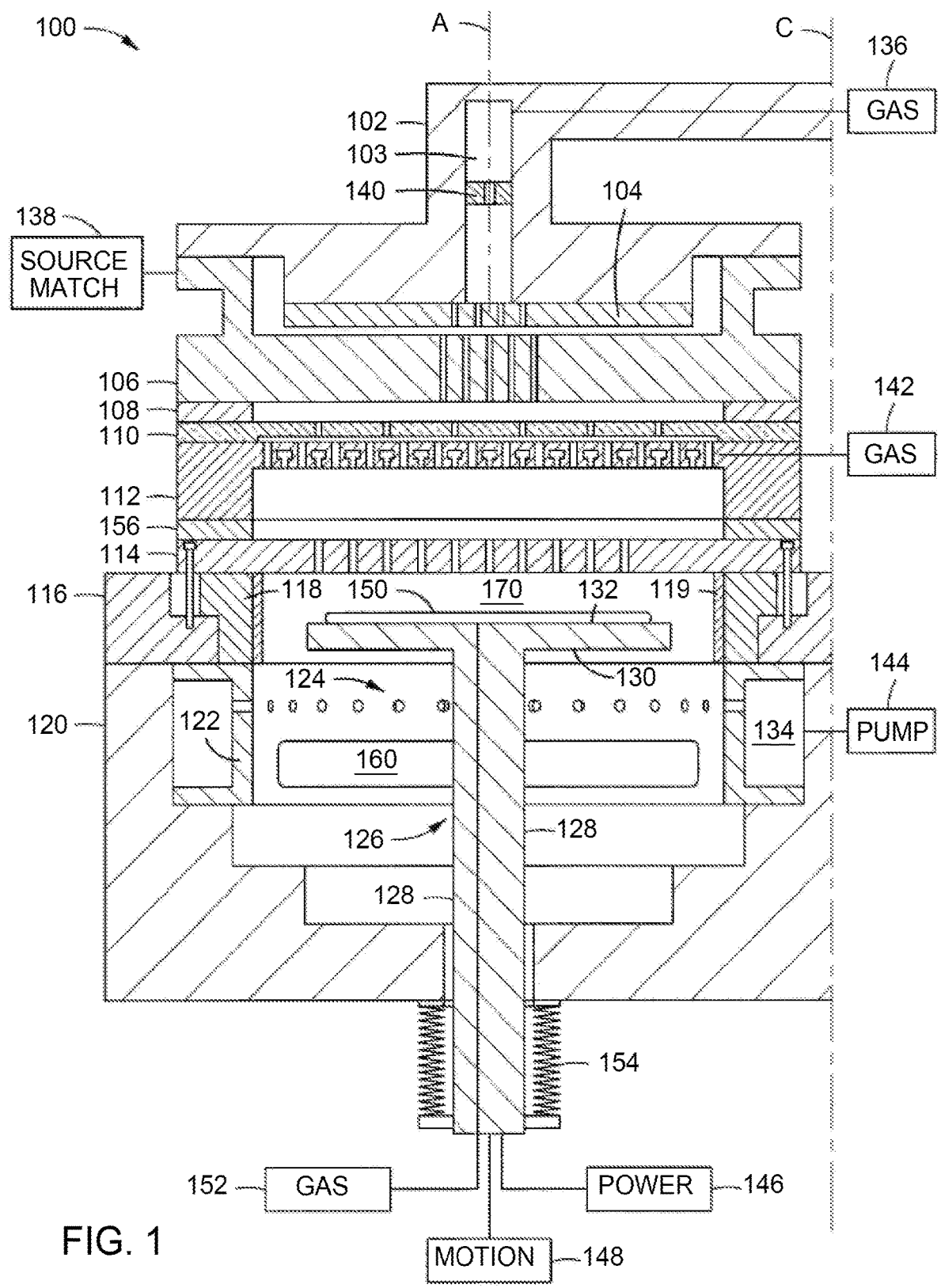
FIG. 1 illustrates a schematic cross-sectional view of a processing chamber, according to one embodiment.

The present disclosure is generally directed towards apparatus and methods for use during post-exposure bake of a semiconductor substrate. Methods and apparatus disclosed herein assist in reducing line edge/width roughness, improving critical dimension uniformity, and improving exposure resolution in a photolithography process for semiconductor processing applications. Methods and apparatus disclosed herein may also assist in reducing the dose of radiation (eUV exposure) used to achieve similar critical dimensions compared to conventional techniques. The apparatus described herein enable a post exposure bake or electric field guided bake of the resist layer on the substrate. The post exposure bake or electric field guided bake may be performed before development of the substrate. The post exposure bake processes described herein have been shown to improve dose sensitivity, reduce line width roughness, and improved critical dimension uniformity when compared to conventional techniques.

A "substrate" or "substrate surface," as described herein, generally refers to any substrate surface upon which processing is performed. Processing includes deposition, etching, patterning and other methods utilized during semiconductor processing. A substrate or substrate surface which may be processed also includes dielectric materials such as silicon dioxide, silicon nitride, organosilicates, and carbon doped silicon oxide or nitride materials. In certain embodiments, the substrate or substrate surface includes photoresist materials, hardmask materials, or other films or layers utilized in the patterning of a substrate. The substrate itself is not limited to any particular size or shape. Although the embodiments described herein are made with generally made with reference to a round 200 mm or 300 mm substrate, other sizes and shapes, such as polygonal, squared, rectangular, curved, or otherwise non-circular workpieces may be utilized according to the embodiments described herein. Other substrate sizes may include 100 mm, 150 mm, 250 mm, 350 mm, 400 mm, 450 mm, etc.

The methods and apparatus disclosed herein improve the photoresist sensitivity and productivity of photolithography processes. The random diffusion of charged species generated by a photoacid generator during a post exposure bake procedure contributes to line edge/width roughness and reduced resist sensitivity. An electrode assembly, such as those described herein, is utilized to apply an electric field and/or a magnetic field to the photoresist layer during photolithography processes. The field application controls the diffusion of the charged species generated by the photoacid generator. Furthermore, an intermediate medium is utilized between the photoresist layer and the electrode assembly so as to enhance the electric field generated therebetween. In some embodiments, the intermediate medium is a fluid such as a liquid, a gas, or a plasma. In another embodiment, the intermediate medium is a non-liquid and non-solid medium.

An air gap defined between the photoresist layer and the electrode assembly results in voltage drop applied to the electrode assembly, thus adversely lowering the electric field strength desired to be generated and applied to the photoresist layer. Inaccurate (e.g., too little or too much voltage and/or current) and/or non-uniform electric field strength at the photoresist layer may result in insufficient or inaccurate voltage power to drive or create charged species in the photoresist layer in certain desired directions, thus leading to diminished line edge profile control to the photoresist layer. Generating a controlled or desired electric field strength increases the accuracy and sensitivity of the photoresist layer to exposure and/or development processes.

In embodiments where the intermediate medium is a non-gas phase medium, such as a slurry, gel, liquid solution, or a solid state medium, voltage levels may be efficiently maintain as applied at a determined range when transmitting from the electrode assembly to the photoresist layer disposed on the substrate. However, using a non-gas phase (e.g., liquid or liquid-like material) as an intermediate medium has several challenges which are still to be resolved. For example, non-gas phase intermediate mediums have limited operation temperatures and may react with a resist layer disposed on the substrate.

Resistivity of non-gas phase fluids is also challenging to control in a stable range. In certain aspects and applications, the desired resistivity of intermediate mediums is about $6 \cdot 10^{10}$ Ohm cm, but due to variations during semiconductor production, the actual resistivity is closer to $5 \cdot 10^{10}$ Ohm·cm. The resistivity and the temperature of the intermediate mediums change during substrate bake operations and are affected by oxygen content, impurities within the medium, and possible polymerization of the medium. The purity of the non-gas phase fluid is difficult to control and may cause defects on the substrate being processed. The non-gas phase fluid interacts differently with the photoresist at exposed regions when compared to unexposed regions and may cause photoresist loss and roughness changes.

Therefore, provided herein are solutions to the above problems that utilize a weakly ionized gas or a mixture of weakly ionized gases as the intermediate medium. The weakly ionized gas or gases are generated by flowing one or more gases into a plasma formation region and forming a high ion density plasma (about $10^5$ ions/cm$^3$ to about $10^{10}$ ions/cm$^3$). The high ion density plasma is later filtered and optionally combined with another gas to form a low ion density plasma ($10^4$ ions/cm$^3$ to $10^7$ ions/cm$^3$). The low ion density plasma mixture includes, but is not limited to, radicals and neutrons and is flowed through a showerhead to be delivered into the volume between the substrate and the opposing electrode. As the low ion density plasma passes through the showerhead and into the gap, the low ion density plasma mixture is filtered and exits the showerhead as a cloud of charged species. The low ion density plasma and the charged species cloud contains different kinds of ions and radicals from either the same gas or a mixture of gases. The charged species cloud includes a lower concentration of ions than the low ion density plasma, such as about $10^4$ ions/cm$^3$ to about $10^6$ ions/cm$^3$.

The electron density is defined as the number of free electrons in a volume. The electron density of each of the plasmas may be similar to the ion density, such that the electron density in the high ion density plasma is about $10^5$ electrons/cm$^3$ to about 10$^{10}$ electrons/cm$^3$, the electron density in the low ion density plasma is about 10$^4$ electrons/cm$^3$ to 10$^7$ electrons/cm$^3$, and the electron density between the substrate and the electrode is about 10$^4$ electrons/cm$^3$ to about 10$^{10}$ electrons/cm$^3$. The electron and ion densities directly above the substrate are selected to form a plasma medium through which an electric field passes, while not treating or reacting with or remaining substantially inert to a resist layer on top of the substrate. The electric field is coupled through the plasma medium, such that the plasma medium is a charge carrying medium through which the electric field is more efficiently maintained. The gases utilized to form the plasma medium as well as the electron/ion densities within the plasma medium further influence if the plasma medium reacts with the resist layer on top of the substrate. Therefore, the shape, density, location, and makeup of the plasma medium are controlled to increase electric field coupling therethrough while reducing reaction with the substrate.

In some embodiments, only one of the high ion density plasma or the low ion density plasma are formed before passing through a showerhead or diffuser into the process volume between the substrate and an opposing electrode. In these embodiments, the ion density between the substrate and the opposing electrode is about 10$^4$ ions/cm$^3$ to about 10$^6$ ions/cm$^3$ and the electron density is about 10$^4$ ions/cm$^3$ to about 10$^6$ ions/cm$^3$.

The gases and plasmas within the process chamber are selected and/or controlled with respect to resistivity, temperature, pressure and composition. A pressure of the processing environment within the process chamber is between about 10 mTorr and about 800 Torr. A voltage is applied between the substrate and the opposing electrode, such that an electric field is formed through the gas or plasma phase medium between the substrate and the opposing electrode. The electric field is controlled by either applying a constant voltage or a constant current by a power supply to one or both of a substrate support or the electrode. The direction of the electric current may be monopolar or bi-directional, such that the electric field is oriented upwards or downwards relatively to the top surface of the substrate. In some embodiments, an alternating current is applied by the power supply.

The low ion density plasma/charged species cloud is delivered into a gap or volume between the substrate and opposing electrode. In embodiments described herein, the opposing electrode is a secondary plasma injection (SPI) showerhead. The SPI showerhead has a plurality of holes for the passage of gas therethrough.

In one embodiment, a bottom surface of the SPI showerhead facing the substrate is formed from a conductive material, such as a metallic or a semiconductor material with controlled resistivity. The top surface of the SPI showerhead faces away from the substrate and is coated by a dielectric layer to reduce or eliminate electrical current or the electric field from being oriented in an opposite direction (upwards) into other portions of a plate stack, such as another showerhead being maintained at ground potential.

In another embodiment, the SPI showerhead is formed from a dielectric material, such as a ceramic, quartz or plastic material. The bottom surface of the SPI showerhead is a metalized surface facing the substrate in this embodiment. Having the SPI showerhead formed from a dielectric material with a metalized surface is beneficial because the holes formed through the SPI showerhead have an inner surface fabricated from the dielectric material. When using the dielectric SPI showerhead with a metalized bottom surface, the voltage applied to the bottom metalized surface facing the substrate orients current and the electric field to flow through the low ion density plasma to the substrate or from the substrate and through the low ion density plasma.

In yet another embodiment, the SPI showerhead is formed from a silicon material, such as a crystalline silicon material, and the resistivity across the thickness of the SPI showerhead is controlled by doping the surface facing the substrate.

Another arrangement to prevent or reduce current or the electric field from being oriented in the upwards direction from the SPI showerhead includes increasing the resistance of the gap between the SPI showerhead and a grounded or floating showerhead above the SPI showerhead. In this embodiment, the gap is filled with a dielectric medium permeable to the low ion density plasma to enable the low ion density plasma to pass therethrough without complete recombination.

If a neutral or uncharged gas is desired to be added to the low ion density plasma, the neutral gas is added to the low density plasma by a dual channel showerhead located above the SPI showerhead. The dual channel showerhead includes at least one set of channels passing completely through the thickness of the showerhead body and a second set of channels with openings only on one side of the showerhead body and configured to provide one or more second gases/plasmas. A plasma generation source is placed on top of SPI showerhead and includes one or more of a capacitively coupled plasma (CCP) arrangement, an inductively coupled plasma (ICP) arrangement, an ultraviolet (UV) arrangement, a microwave arrangement, or a remote plasma source (RPS) arrangement. In some embodiments, a lower electrode of the CCP architecture is a showerhead or a diffuser, which serves as a plasma recombination member. Plasma recombination includes the removal of ions within the plasma to increase the ratio of radicals to ions. In embodiments where the diffuser is placed on the bottom of the CCP architecture, the plate stack may be equipped on preexisting chamber architectures.

In one embodiment, the plate stack described herein may be utilized on a SELECTRA® chamber available from Applied Materials, Inc, Santa Clara, CA. It is contemplated that other suitably configured apparatus from other manufacturers may also benefit from the embodiments described herein. The diffuser may have a DC bias applied thereto relative to a substrate support. In this example, the diffuser is connected to DC power supply through an RF filter which enables an independent RF return path. The diffuser is electrically insulted from the chamber lid or body. The partially recombined or low ion density plasma flows into the process region in which the substrate is disposed and electric current/electric field flows between the substrate and the diffuser. In this embodiment, neither an SPI showerhead or a dual channel showerhead are utilized.

Within each of the embodiments described herein, while being exposed to the low ion density plasma, the substrate sits on a substrate support pedestal. The substrate support pedestal is positively or negatively charged with reference to the SPI showerhead. The substrate support pedestal includes vacuum chucking components and capabilities. The substrate support pedestal is a heated pedestal configured to control a temperature of the substrate. The heated pedestal is used to bake the substrate and the process environment within the chamber is maintained at a sub-atmospheric pressure, e.g., in a vacuum environment. Optionally, an electric current/electric field is applied to the substrate during the substrate baking process in a sub-atmospheric environment.

FIG. 1 illustrates a schematic cross-sectional view of a process chamber 100, according to one embodiment. The process chamber 100 is configured to perform field guided post-exposure bake operations on a substrate with a photoresist or chemically modified resist layer disposed thereon. The process chamber 100 described herein may be mirrored across a centerline C, such that a second process chamber (not shown) form a unitary structure coupled to the same vacuum processing platform. In one embodiment, the platform is the PRODUCER® apparatus available from Applied Materials, Inc., Santa Clara, CA. However, it is contemplated that other suitably configured apparatus available from other manufacturers may benefit from the embodiments described herein.

The process chamber 100 includes a mixing block 102, which serves as an RF electrode and/or a gas manifold. Process gasses are provided to the mixing block 102 from the gas source 136. The process gases from the gas source 136 enter the mixing block 102 through a feed-through member 103. In one embodiment, the feed-through member 103 is formed from a polymeric material, such as polytetrafluoroethylene. The mixing block 102 includes a flow centering insert 140 disposed therein. The flow centering insert 140 may be a ring like apparatus with an opening 204 formed therein. The opening 204 is formed through the center of the flow centering insert 140 and the opening 204 may be a single aperture or may be multiple apertures. The flow centering insert 140 improve concentric flow distribution of process gases within the plate stack of the process chamber 100. The flow centering insert 140 additionally assists in reducing backflow of plasma into the mixing block 102.

The mixing block 102 is electrically coupled to a first diffuser 104 and a face plate 106 that serve to redirect flow of the source gases so that gas flow is uniform (uniform from left to right in the view of FIG. 1). It should be noted that all of the diffusers or screens herein may be characterized as electrodes, as any such diffusers or screens may be coupled to a particular electrical potential. An insulator 108 electrically insulates the mixing block 102, including the face plate 106, from a second diffuser 110. The second diffuser 110 serves as a second electrode counterfacing the face plate 106. In one embodiment, the second diffuser 110 is a selectivity modulating device (SMD) and serves as an ion blocker plate. The first diffuser 104 and the face plate 106 are formed of a conductive material, such as a metal. The conductive material as described herein may be aluminum or an aluminum alloy. The insulator 108 is an insulation material, such as a dielectric. The insulation material may be a ceramic, such as aluminum oxide, or a quartz material.

Each of the first diffuser 104, the face plate 106, and the second diffuser 110 have a plurality of holes disposed therethrough to enable process gases to be flown through the plate stack (e.g., first diffuser 104, face plate 106, insulator 108, second diffuser 110, gas distribution device 112, insulator plate 156, and blocking screen 114). At least a portion of the mixing block 102, the face plate 106, and the second diffuser 110 are formed of a conductive material, such as aluminum or an aluminum alloy.

Surfaces of the face plate 106, the second diffuser 110 and the insulator 108 define a first plasma generation region 210 where a first plasma is created when the gas from the gas source 136 is present and energy is provided at the face plate 106 through the mixing block 102.

Surfaces of the face plate 106 and the second diffuser 110 that face the first plasma generation region 210 directly may be coated with ceramic layers of, for example, yttria ($Y_2O_3$) or alumina ($Al_2O_3$) for protection from bombardment by energetic plasma products generated in the first plasma generation region 210. The ceramic coating may be formed by an electron beam coating process, an anodization process, and/or a non-pore anodization process. Other suitable coatings include nickel plating and surface oxidation processes, for example, by exposure to a concentrated $HNO_3$ solution. Other surfaces of the face plate 106 and the second diffuser 110 that are not necessarily exposed directly to plasma, but are exposed to reactive gases and/or radicals generated by plasmas, may be coated either with ceramic layers (e.g., yttria, alumina) or with a suitable passivating layer (e.g., an anodized layer, or a chemically generated alumina layer) for chemical resistance. The insulator 108 may be any insulator, and in certain embodiments, is formed from a ceramic material.

Plasma products generated in the first plasma generation region 210 pass through the second diffuser 110 that further promotes the uniform distribution of plasma products and assists in electron temperature control. Upon passing through the second diffuser 110, the plasma products pass through a gas distribution device 112. The gas distribution device 112 is also held at a similar voltage as the second diffuser 110 as the gas distribution device 112 and the second diffuser 110 contact one another at an edge. Apertures 216 (FIG. 2A) that pass completely through the gas distribution device 112 are of a diameter at least three times a diameter of apertures within the second diffuser 110. The gas distribution device 112 includes a second and/or a third set of gas channels 214 that may be used to introduce one or more additional gases to the plasma products as they enter a second plasma generation region 218. The second and/or third set of gas channels 214 are coupled to a second gas source 142. The second gas source 142 is configured to supply one or more inert or neutral gases and may optionally assist in reducing the ionization of the plasma produced between the face plate 106 and the second diffuser 110. The one or more additional gases emerge from a side of gas distribution device 112 distal to second diffuser 110. The gas distribution device 112 is made of aluminum or an aluminum alloy, and like the face plate 106 and the second diffuser 110 discussed above, may be coated with a passivating layer for chemical resistance, or may be coated with a ceramic layer.

Gases and plasmas flowed through the gas distribution device 112 enter the second plasma generation region 218 (FIG. 2A) where the gases and plasmas mix. The second plasma generation region 218 is a plenum formed between the gas distribution device 112 and a blocking screen 114. Both the gas distribution device 112 and the blocking screen 114 may be held at different voltage potentials to control the ion density of the second plasma formed therebetween. In some embodiments, both the distribution device 112 and the blocking screen 114 are grounded, such that the second diffuser 110 and the gas distribution device 112 are connected to a first ground 253 while the blocking screen 114 is connected to a second ground 255. The gas distribution device 112 and the blocking screen 114 are separated by an insulator plate 156. The insulator plate 156 is formed from a ceramic or a plastic material and may be similar to the insulator 108. In one embodiment, the insulator plate 156 is formed of an aluminum oxide material. In other embodiments, the insulator plate 156 is formed of a plastic material, such as a fluorocarbon containing material. The plastic material may be polytetrafluoroethylene (PTFE) or polyether ether ketone (PEEK). The insulator plate 156 is selected to embody desirable electrical insulation properties, such that the resistivity of the insulator plate 156 is greater than about $10^{15}$ Ω·cm, such as greater than about $10^{16}$ Ω·cm, such as greater than about $10^{17}$ Ω·cm, such as greater than about $10^{18}$ Ω·cm. The insulator plate 156 enables control of the voltage differential between the gas distribution device 112 and the blocking screen 114. The blocking screen 114 is a plasma blocking screen or an ion blocking screen, such that the plasma is filtered as it passes through the blocking screen 114 and the concentration of ions is reduced. The blocking screen 114 may alternatively be described as a showerhead or a third diffuser plate.

Portions of the blocking screen 114 which are exposed directly to plasma may be coated with ceramic (e.g., alumina or yttria) while surfaces that are not exposed directly to plasma may also be coated with ceramic. Both the exposed and unexposed surfaces are advantageously coated with a passivating layer for chemical resistance to reactive gases and activated species.

Figure 2A:
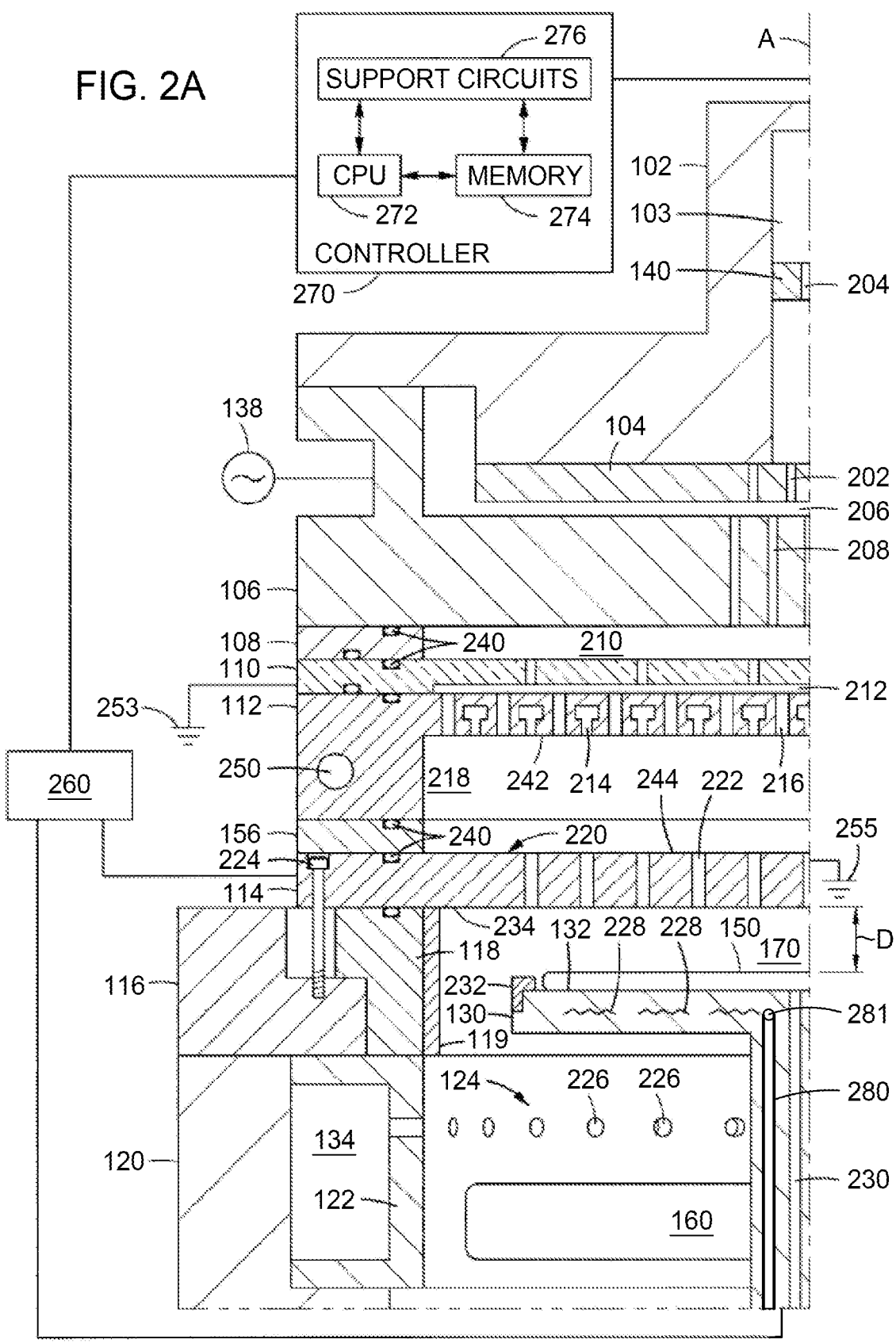
FIG. 2A illustrates a schematic cross-sectional view of a portion of the processing chamber of FIG. 1, according to one embodiment.

The blocking screen 114 constitutes the bottom plate of the plate stack as described in FIG. 1 and FIG. 2A. The blocking screen 114 is a showerhead configured to prevent plasma from traveling back up the plate stack from the process volume 170. The blocking screen 114 is also configured to reduce the number of ions within a plasma passing through the blocking screen 114 and into the process volume 170. The bottom surface of the blocking screen 114 faces a process volume 170 and a substrate support surface 132 of a substrate support 130.

The substrate support 130 is an upper portion of a substrate support assembly 126. The substrate support assembly 126 further includes a shaft 128 and bellows 154 connecting the substrate support assembly 126 to a lower chamber body 120. The bellows 154 form a seal between the process volume 170 and an outside environment. One or more backside gas sources 152 are coupled to the substrate support assembly 126 to supply backside gas to the substrate support surface 132 of the substrate support 130. The backside gas sources 152 may also include a pump for forming a vacuum on the backside of the substrate 150.

A power source 146 and motion apparatus 148 are also coupled to the substrate support assembly 126. The power source 146 may be an AC or a DC power source. The power source 146 is configured to supply power to the motion apparatus 148 and/or one or more heating devices 228 (FIG. 2A) within the substrate support 130. The motion apparatus 148 is configured to enable movement of the substrate support assembly 126, such as raising or lowering the substrate support assembly 126, rotating the substrate support assembly 126 about a central axis A, or tilting the substrate support assembly 126. In some embodiments, the substrate support 130 is an aluminum substrate support 130. In other embodiments, the substrate support 130 is a ceramic, or a metal alloy.

The process chamber 100 further includes an upper chamber body 116 coupled to the lower chamber body 120. The upper chamber body 116 and the lower chamber body 120 are coupled together to define at least a portion of the process volume 170. The plate stack as described herein is disposed on top of the upper chamber body 116. The lower chamber body 120 includes at least one transfer passage 160 disposed therethrough. A pumping liner 122 is disposed radially inward of the lower chamber body 120. The pumping liner 122 includes a plurality of openings 124 disposed therethrough. The openings 124 connect an exhaust plenum 134 and the process volume 170, such that gas is removed via the exhaust plenum 134 by a pump 144. The openings 124 are disposed symmetrically about the pumping liner 122. A showerhead spacer 118 is disposed radially inward of the upper chamber body 116 and formed of a conductive material, such as an aluminum material. The showerhead spacer 118 further defines a portion of the process volume 170. An upper chamber liner 119 is disposed radially inward of the upper chamber body 116 and the showerhead spacer 118. The upper chamber liner 119 is an insulator. The upper chamber liner 119 is fabricated from a ceramic material. In some embodiments, the upper chamber liner 119 is fabricated from an aluminum oxide material or an aluminum nitride material.

A source match device 138, such as an RF matching circuit, is coupled to the plate stack, such that the source match device 138 is configured to be in electrical communication with the face plate 106. The source match device 138 is configured to apply an RF current or voltage to the face plate 106. The source match device 138 is configured to produce a plasma between the face plate 106 and the second diffuser 110.

FIG. 2A illustrates a schematic cross-sectional view of a portion of the processing chamber 100 of FIG. 1, according to one embodiment. FIG. 2A further illustrates the passages and plenums formed within the plate stack. As described herein an opening 204 is formed through the flow centering insert 140. Openings 202 are formed through the first diffuser 104 and in fluid communication with a first plenum 206. Openings 208 are formed through the face plate 106 and in fluid communication with the first plasma generation region 210.

The second diffuser 110 also includes a plurality of openings to enable process gases from the first plasma generation region 210 to flow through the second diffuser 110 and into a second plenum 212 formed between the second diffuser 110 and the gas distribution device 112.

The apertures 216 through the gas distribution device 112 are in fluid communication with both the second plenum 212 and the second plasma generation region 218. The gas distribution device 112 further includes one or more heaters 250 disposed therein to enable controlled heating of the gas distribution device. The one or more heaters may include resistive heating elements, infrared heaters, or an induction heater. In some embodiments, the one or more heaters 250 can also be used to heat the substrate 150. The gas distribution device 112 and/or the second diffuser is electrically coupled to a first ground 253. Alternatively, one of the gas distribution device 112 or the second diffuser 110 is coupled to a power source to enable a voltage differential different from that applied to either of the face plate 106 or the blocking screen 114.

An opening 220 is formed within the insulator plate 156 to form a portion of the second plasma generation region 218. The blocking screen 114 further includes a plurality of apertures 222 which fluidly couple the second plasma generation region 218 and the process volume 170. Due to the insulator plate 156, the blocking screen 114 and the gas distribution device 112 may be held at different electrical potentials to enable the plasma strength within the second plasma generation region 218 to be controlled. The apertures 222 through the blocking screen 114 are offset from the apertures through the second diffuser 110, such that a central axis running parallel to the direction of each of the apertures within the blocking screen 114 is offset from any central axis of an aperture formed through the second diffuser 110. Offsetting the apertures reduces the light exposure of the photoresist on the substrate 150 to a high ion density plasma formed within the first plasma generation region 210. The blocking screen 114 includes a top surface 244 and a bottom surface 234. The blocking screen 114 may be coupled to the upper chamber body 116 via one or more fasteners 224 disposed through the blocking screen 114.

The plurality of openings 124 of the pumping liner 122 may further include individual apertures 226 formed through the pumping liner 122. The individual apertures 226 circumscribe the pumping liner 122 to enable even removal of gases from the process volume 170 around the substrate support 130. In embodiments described herein, the one or more heating devices 228 disposed within the substrate support 130 are resistive heating devices. The backside gas sources 152 are fluidly coupled to the substrate support surface 132 of the substrate support 130 via one or more gas conduits 230. An edge ring 232 may also be disposed on the edges of the substrate support 130 around the substrate 150.

A plurality of sealing rings 240 are disposed between each of the plates within the plate stack, such as between the face plate 106 and the insulator 108, between the insulator 108 and the second diffuser 110, between the second diffuser 110 and the gas distribution device 112, between the gas distribution device 112 and the insulator plate 156, and between the insulator plate 156 and the blocking screen 114. The sealing rings 240 are configured to seal the various regions 210, 218 and plenums 206, 212 to prevent the escape of plasma products from the chamber 100 and to enable vacuum integrity within the chamber 100.

As described above, a bottom surface 234 of the blocking screen 114 facing the substrate 150 is formed from a conductive material, such as a metallic or a semiconductor material with controlled resistivity. The top surface 244 of the blocking screen 114 faces away from the substrate 150 and is coated by a dielectric layer (not shown) to reduce or eliminate electrical current or the electric field from orienting in an opposite direction (upwards) into other portions of a plate stack, such as the gas distribution device 112.

In another embodiment, the blocking screen 114 is formed from a dielectric material, such as a ceramic, quartz or plastic material. The bottom surface 234 of the blocking screen 114 is a metalized surface facing the substrate 150 in this embodiment. Having the blocking screen 114 formed from a dielectric material with a metalized surface is beneficial in that the apertures 222 formed through the blocking screen 114 have an inner surface made from dielectric material. When using the dielectric blocking screen 114 with a metalized bottom surface, the voltage applied to the bottom metalized surface facing the substrate 150 orients current and the electric field through the low ion density plasma within the process volume to the substrate 150 or from the substrate 150 and through the low ion density plasma.

In yet another embodiment, the blocking screen 114 is formed from a silicon material, such as a crystalline silicon material, and the resistivity across the thickness of the blocking screen 114 is controlled by doping the surface facing the substrate.

In some embodiments, coating the surface of the blocking screen 114 in a dielectric material is performed on the entire surface of the blocking screen 114. Similarly, forming a metal coating over an entire ceramic blocking screen 114 may be possible. The distances between the blocking screen 114 and other chamber components would then otherwise be controlled to account for the change in electric field distribution within the plate stack.

A voltage supply 260 is connected between the blocking screen 114 and the substrate support 130. The voltage supply 260 enables control of the voltage differential between the blocking screen 114 and the substrate support 130. The voltage supply may be configured to create a voltage differential of about 0V to about 2000 V, such as about 10 V to about 2000 V. The voltage supply may further include AC/DC waveform control, such that a DC voltage may be applied or an AC voltage with a frequency of less than or equal to about 7.5 kHz, such as about 0 kHz to about 7.5 kHz. Controlling the voltage differential between the substrate support 130 and the blocking screen 114 enables the control of the electric field therebetween during baking of a resist disposed on the substrate 150. Either one of the blocking screen 114 or the substrate support 130 may be grounded. In the embodiment of FIG. 2A, the blocking screen 114 is grounded and the substrate support 130 is either positively or negatively charged to form an electric field between the substrate support 130 and the blocking screen 114.

The substrate support 130 also includes a refrigerant conduit 280. The refrigerant conduit 280 circulates refrigerant or cooling fluid through refrigerant lines 281. The refrigerant lines 281 circulate refrigerant through the substrate support 130. In one embodiment, the refrigerant lines 281 are disposed within the substrate support 130 and below the substrate support surface 132. The refrigerant lines 281 may be disposed in a circular pattern, boustrophedonic pattern, or other suitable pattern which enables substantially consistent and uniform cooling throughout the substrate support. In one embodiment, the refrigerant lines 281 are disposed in the same plane as the heating devices 228. Alternatively, the refrigerant lines 281 are disposed in a different plane from a plane occupied by the heating devices 228. The refrigerant lines 281 enable cooling and temperature control of the substrate 150 and substrate support 130 during operations. Suitable heat transfer fluids that may be circulated through the refrigerant lines 281 include, but are not limited to, water, glycol based fluids, and polymer based fluids, such as Galden® or the like.

The above-described chamber 100 can be controlled by a processor based system controller such a controller 270. For example, the controller 270 may be configured to control flow of various precursor gases via the gas sources 136, 142, 152 and coordinate operation the source match device 138 to facilitate plasma generation and flows within the chamber 100. The controller 270 may also be configured to control all aspects of electric field generation within the chamber 100 by modulating and controlling application of voltages to one or more of the components of the plate stack and the pedestal to generate an electric field within the process volume 170. The controller 270 further operates to control various stages of a substrate process sequence.

The controller 270 includes a programmable central processing unit (CPU) 272 that is operable with a memory 274 and a mass storage device, an input control unit, and a display unit (not shown), such as power supplies, clocks, cache, input/output (I/O) circuits, and the like, coupled to the various components of the chamber 100 to facilitate control of the substrate processing. The controller 270 also includes hardware for monitoring substrate processing through sensors in the chamber 100, including sensors monitoring flow, RF power, voltage potential and the like. Other sensors that measure system parameters such as substrate temperature, chamber atmosphere pressure and the like, may also provide information to the controller 270.

To facilitate control of the chamber 100 and associated plasma and electric field formation processes, the CPU 272 may be one of any form of general purpose computer processor that can be used in an industrial setting, such as a programmable logic controller (PLC), for controlling various chambers and sub-processors. The memory 274 is coupled to the CPU 272 and the memory 274 is non-transitory and may be one or more of readily available memory such as random access memory (RAM), read only memory (ROM), floppy disk drive, hard disk, or any other form of digital storage, local or remote. Support circuits 276 are coupled to the CPU 272 for supporting the processor in a conventional manner. The plasma and electric field formation and other processes are generally stored in the memory 274, typically as a software routine. The software routine may also be stored and/or executed by a second CPU (not shown) that is remotely located from the hardware being controlled by the CPU 272.

The memory 274 is in the form of computer-readable storage media that contains instructions, that when executed by the CPU 272, facilitates the operation of the chamber 100. The instructions in the memory 274 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the chamber 100. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others. In one example, the machine learning algorithm is utilized to modulate RF power and precursor gas flow to form a plasma and then facilitate maintenance of a low ion density plasma which contains a greater concentration of radicals than ions. The formation of charges species in this manner may be refined and improved by identifying constituents of the charged species cloud (e.g., radicals and/or ions) and modifying chamber process or apparatus characteristics to form and maintain a charged species cloud which exhibits desirable characteristics as an electric field coupling medium between an electrode (e.g., screen 114) and the substrate support 130.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The distance between the perforated bottom surface 242 of the gas distribution device 112 and the top surface 244 of the blocking screen 114 is less than about 20 mm, such as less than about 20 mm, such as about 5 mm to about 18 mm, such as about 10 mm to about 18 mm, such as about 12 mm to about 17 mm. The distance D between the bottom surface 234 of the blocking screen 114 and the substrate support surface 132 is about 2 mm to about 60 mm, such as about 5 mm to about 56 mm, such as about 16 mm to about 56 mm, such as about 32 mm to about 56 mm. The gaps between the gas distribution device 112, the blocking screen 114, and the substrate support surface 132 are small enough to enable good electric field uniformity while large enough to prevent breakdown and discharge of the gases within the second plasma generation region 218 and the process volume 170, respectively. The distance D between the blocking screen 114 and the substrate support surface 132 is configured to enable control of the plasma formed in the process volume 170 while reducing the interaction of the plasma with the substrate 150. The plasma is controlled to provide a uniform and uni-directional electric field passing therethrough to interact with the substrate 150. The plasma within the process volume 170 acts to electrically couple the substrate 150 and the blocking screen 114 and enables better control of the electric field through the process volume 170.

Figure 2B:
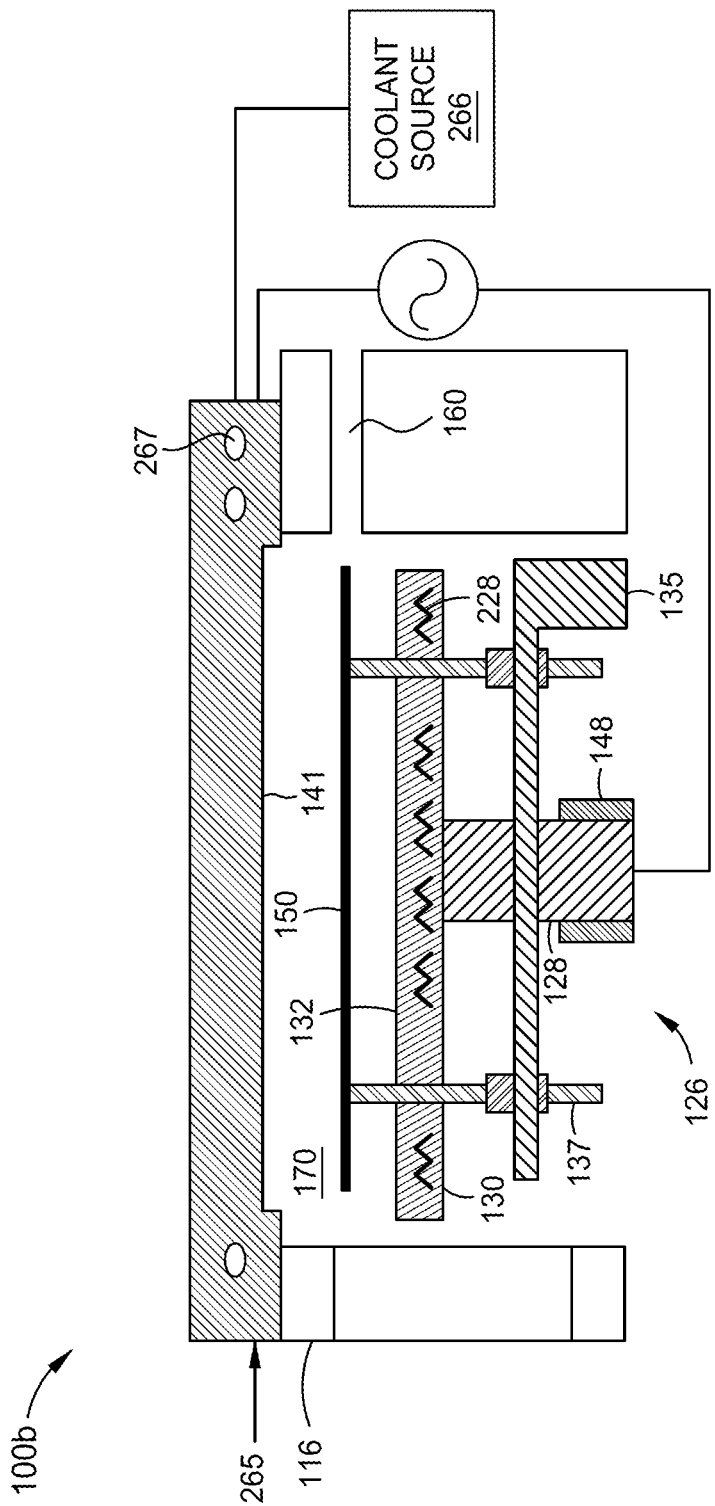
FIG. 2B illustrates a schematic cross-sectional view of a portion of the processing chamber, according to one embodiment.

FIG. 2B illustrates a schematic cross-sectional view of a process chamber 100b, according to one embodiment. The process chamber 100b is configured to perform field guided post-exposure bake operations on a substrate 150 with a photoresist or chemically modified resist layer disposed thereon. However, it is contemplated that other suitably configured process chambers may benefit from the embodiments described herein.

The process chamber 100b includes an upper chamber body 116 coupled to the lower chamber body 120. The upper chamber body 116 and the lower chamber body 120 are coupled together to define at least a portion of the process volume 170. A substrate support 130 is disposed in the process volume 170 and utilized to support the substrate 150 thereon during processing. In the example of FIG. 2B, a cooling plate 265 is cooled using temperate control techniques, such as flowing heat transfer fluid therethrough and/or via thermo-electric devices.

The lower chamber body 120 includes at least one substrate transfer passage 160 disposed therethrough. The transfer passage 160 may have a slit valve door configured to provide access to the process volume 170 by a transfer robot moving the substrate 150 into and out of the process volume 170. A pumping liner may be disposed radially inward of the lower chamber body 120. The pumping liner includes a plurality of openings connecting an exhaust plenum and the process volume 170 such that gas is removed via the exhaust plenum by a pump.

The cooling plate 265 is disposed close to the substrate support 130. The substrate 150 may be moved immediately adjacent the cooling plate 265 to assist regulating, for example cooling, the substrate 150 after a post bake process.

In the example depicted in FIG. 2B, the cooling plate 265 has a bottom surface 141 facing the process volume 170. Although in the example depicted in FIG. 2B the cooling plate 265 is cooled and immediately adjacent the substrate support 130, in other embodiments, other types of cooled plates may be disposed a distance away from the substrate support 130.

The cooling plate 265 has integrated channels 267 connected with a source of coolant 266. The integrated channels 267 may spiral through cooling plate 265. The source of coolant 266 can provide refrigerant such as deionized water, glycol, an inert, high-performance, fluorinated heat transfer fluid, or other fluid suitable as a coolant. Alternately, or additionally, the cooling plate 265 may have thermo-electric cooling devices, such as a Peltier cooling elements and the like. The thermo-electric cooling devices may be electrically driven to provide cooling (or even heating) to the cooling plate 265.

The cooling plate 265 can be any conductive material. For example, the cooling plate 265 is aluminum. In yet another example, the cooling plate 265 is an aluminum alloy with coating. In some embodiments, the source of coolant 266 supplies refrigerant to the integrated channels 267 during a bake operation and a cooling operation.

While being exposed to a bake process, the substrate 150 sits on the substrate support 130 portion of a substrate support assembly 126. The substrate support 130 is a heated pedestal configured to control a temperature of the substrate. The substrate support assembly 126 further includes a shaft 128 and bellows connecting the substrate support assembly 126 to the lower chamber body 120. The bellows form a seal between the process volume 170 and an outside environment. One or more backside gas sources may be coupled to the substrate support assembly 126 to supply backside gas to the substrate support surface 132 of the substrate support 130.

A power source and motion apparatus are also coupled to the substrate support assembly 126. The power source may be an AC or a DC power source. The power source is configured to supply power to the motion apparatus 148 and/or heating devices 228 within the substrate support 130. The motion apparatus 148 is configured to enable movement of the substrate support assembly 126, such as raising or lowering the substrate support assembly 126, rotating the substrate support assembly about a central axis, or tilting the substrate support 130.

The substrate support assembly 126 additionally has a substrate lifting device 137. The substrate lifting device 137 is coupled to a movement assembly 135 for raising and lowering the substrate lifting device 137. The substrate lifting device 137 is raised to an upper position for accepting the substrate 150 from the transfer robot. The substrate lifting device 137 is lowered to place the substrate 150 onto the substrate support surface 132 of the substrate support 130 for processing. The substrate lifting device 137 may be lift pins, a hoop, edge support ring, or any suitable device for accepting the substrate 150 from a robot blade and moving the substrate from the substrate support surface 132 of the substrate support 130 to a raised position above the substrate support 130. In one example, the substrate lifting device 137 is a plurality of lift pins. The lift pins can move to an elevated position to pick the substrate 150 and balance the substrate 150 thereon the pins. The elevated position places the substrate 150 proximate to the cooling plate 265. For example, the elevated position places the substrate 150 less than 10 millimeters from the cooling plate 265. For example, the elevated position places the substrate 150 between about 1 millimeter and about 10 millimeters from the cooling plate 265. The lift pins can move below substrate support surface 132 of the substrate support 130 into lift pin holes while the substrate 150 is engaged with the heated substrate support 130 during processing. In another example, the substrate lifting device 137 is a hoop having and openings for the robot blade. The hoop can move to an elevated position to pick the substrate 150 and hold the substrate 150 along its edge. The hoop can move into a groove in the substrate support surface 132 of the substrate support 130 while the substrate 150 is engaged with the heated substrate support 130 during processing.

Figure 3:
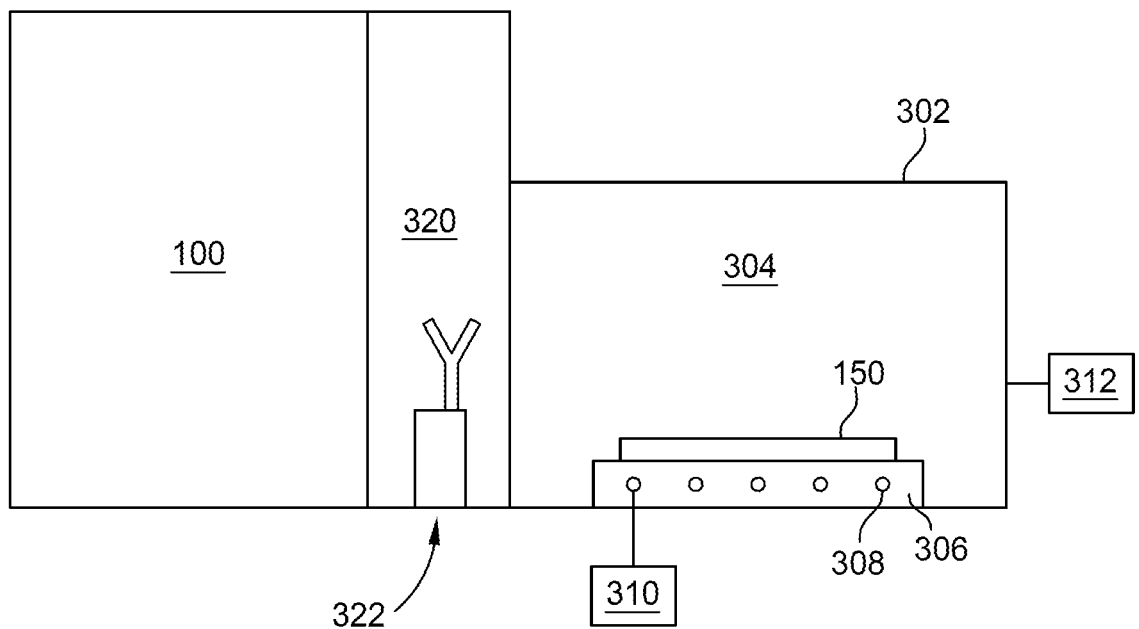
FIG. 3 illustrates a schematic view of the processing chamber of FIG. 1 and a cooling chamber, according to one embodiment.

FIG. 3 illustrates a schematic view of the process chamber 100 of FIG. 1 and a cooling chamber 302. One aspect of processing the substrate, as previously described, includes heating or baking the substrate to facilitate reaction of the chemically amplified resist and advance resist deprotection. In certain embodiments, a low ion density plasma is utilized to as a charge transfer medium to couple an electric current/electric field to the substrate and facilitate directional migration of species within the resist during the resist deprotection process. In other embodiments, baking the substrate is performed without application or generation of an electric current or electric field to the photoresist.

In another embodiment, the substrate is heated and baked without application of electric current/electric field to the substrate in the chamber 100. For example, the substrate is heated to between about 50° C. and about 250° C. for a period of time between about 20 seconds and about 90 seconds. For example, between about 90° C. and about 135° C. for a period of time between about 20 seconds and about 90 seconds. In yet another example, between about 110° C. and about 120° C. for a period of time between about 20 seconds and about 90 seconds. The baking process is performed at sub-atmospheric pressures in a vacuum environment. For example, the process volume 170 of the process chamber 100 is maintained in the vacuum environment at a pressure of between about 0.5 Torr and about 100 Torr. For example, the process volume 170 of the process chamber 100 is maintained at a pressure of between about 1 Torr and about 55 Torr, for example between about 10 Torr and about 50 Torr. The sub-atmospheric pressure in the chamber 100 is generated by the pump 144. The sub-atmospheric pressure during the baking process may be held constant or varied during the baking process. In one embodiment, inert gases are delivered to the process volume 170 during the baking process. Suitable inert gases include, but are not limited to, nitrogen, helium, argon, and other sufficiently non-reactive gases.

Utilization of a vacuum environment during the baking process is believed to reduce the probability of trace contamination, e.g., particle contamination, of the substrate which may lead to non-uniformities in critical dimensions of features such as contact holes and the like. As such, the vacuum bake process improves substrate-to-substrate uniformity, and it is further believed that the vacuum baking environment provides additional benefits of reducing line edge and width roughness, reducing device defectivity, and improving device yield.

After the baking process is complete, the substrate 150 is cooled. In one embodiment, the substrate 150 is cooled from the elevated baked temperature to about room temperature, e.g., between about 20° C. and about 30° C., over a period of time between about 20 seconds and about 60 seconds. The substrate 150 may be cooled while still under vacuum in the process chamber 100. To facilitate cooling in another embodiment, the substrate is transferred from the process chamber 100 to a cooling chamber 302. In one embodiment, the cooling chamber 302 is a transfer chamber or a load lock chamber. The cooling chamber 302 is coupled to the process chamber 100 in one embodiment. Alternatively, a transfer chamber 320 is disposed between the process chamber 100 and the cooling chamber 302. In certain embodiments, a robot 322 is disposed in the transfer chamber 320 and the robot 322 includes a substrate transfer blade to facilitate moving of the substrate 150 from the process chamber 100 to the cooling chamber 302.

In some embodiments, the baking and cooling of the substrate 150 occur at about the same pressure. In some embodiments, baking occurs at a higher pressure than the cooling while both pressures are sub-atmospheric. In some embodiments, baking occurs at a lower pressure than the cooling while both pressures are still sub-atmospheric.

The cooling chamber 302 defines a volume 304. A chill plate 306 is disposed within the volume 304 and the substrate 150 is positioned on the chill plate 306 to facilitate cooling of the substrate 150 after the bake process performed in the process chamber 100. The chill plate 306 is a type of substrate support capable of cooling a substrate by flowing refrigerant through internal cavities within the chill plate. In one embodiment, a temperature of the chill plate is controlled by flowing a fluid through channels 308 in the chill plate 306. The channels 308 are in fluid communication with a fluid source 310 and fluid is flowed from the fluid source 310 through the channels 308 to cool the substrate 150 disposed on the chill plate 306. In one embodiment, the fluid supplied from the fluid source 310 is a heat transfer liquid, such as water, or other suitable liquids.

In one embodiment, cooling of the substrate 150 in the cooling chamber 302 is performed in a vacuum environment. For example, the volume 304 is maintained at a sub-atmospheric pressure between about 0.5 Torr and about 100 Torr. The pressure maintained in the volume 304 may be constant or varied during the cooling process. A pump 312 or other suitable vacuum generation apparatus is in fluid communication with the volume 304 and is responsible for reducing the pressure in the volume 304. In one embodiment, inert gases are delivered to the volume 304 during the cooling process. Suitable inert gases include, but are not limited to, nitrogen, helium, argon, and other sufficiently non-reactive gases.

Figure 4:
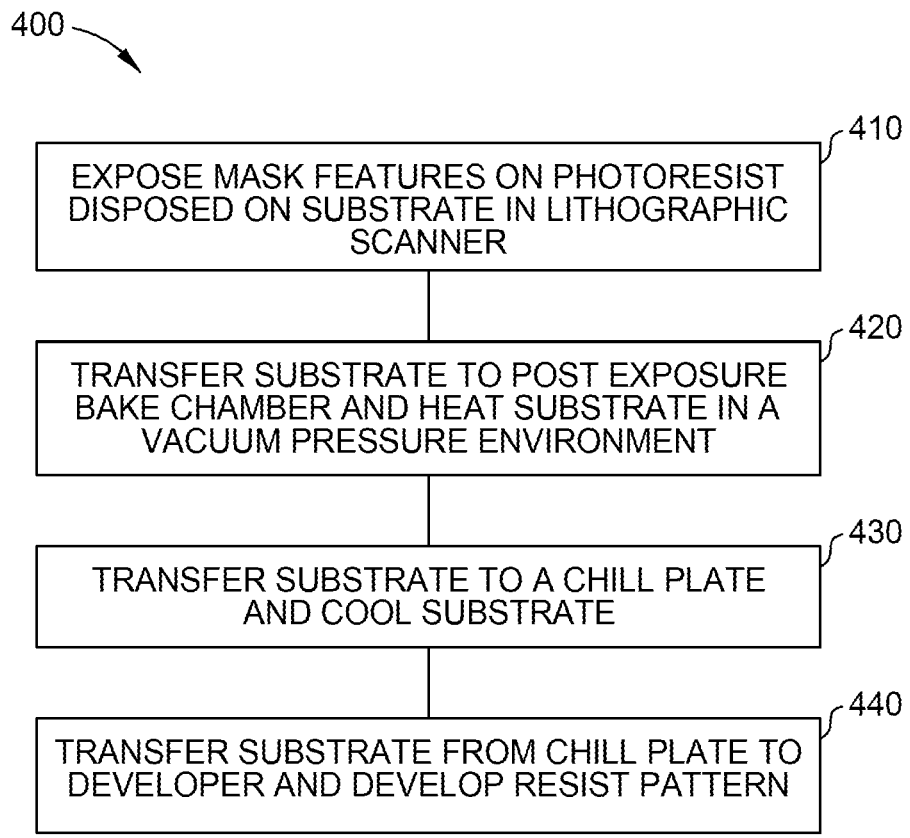
FIG. 4 illustrates operations of a method for baking a substrate in a vacuum pressure environment, according to one embodiment.

FIG. 4 illustrates operations of a method 400 for baking a substrate in a vacuum pressure environment, according to one embodiment. At operation 410, mask features are exposed on photoresist disposed on a substrate in a lithographic scanner. The lithographic exposure process may be performed at ambient pressures or under vacuum pressure depending upon the type of exposure process utilized. At operation 420, the substrate is transferred to a post exposure bake chamber and placed onto the substrate support 130. The pressure maintained in the process volume in the post exposure bake chamber is lowered to a sub-atmospheric pressure and the substrate is heated in a vacuum pressure environment. Examples of substrate bake parameters in a vacuum pressure environment are described with respect to FIG. 3.

At operation 430, the substrate is transferred to a chill plate and the substrate is cooled. For example, with reference to FIG. 3, the substrate 150 is transferred from the process chamber 100 to the cooling chamber 302 where the substrate 150 is positioned on the chill plate 306 to facilitate cooling of the substrate after the bake process performed in the process chamber 100. At operation 440, the substrate is transferred from the chill plate to a developer and the photoresist pattern is developed. In some embodiments, at least operations 420, 430, and 440 are all done, and the substrate stays, at sub-atmospheric pressure. In one embodiment, the substrate is transferred back to a lithography track apparatus and a wet development process is performed at ambient pressures to further develop the resist.

Figure 5:
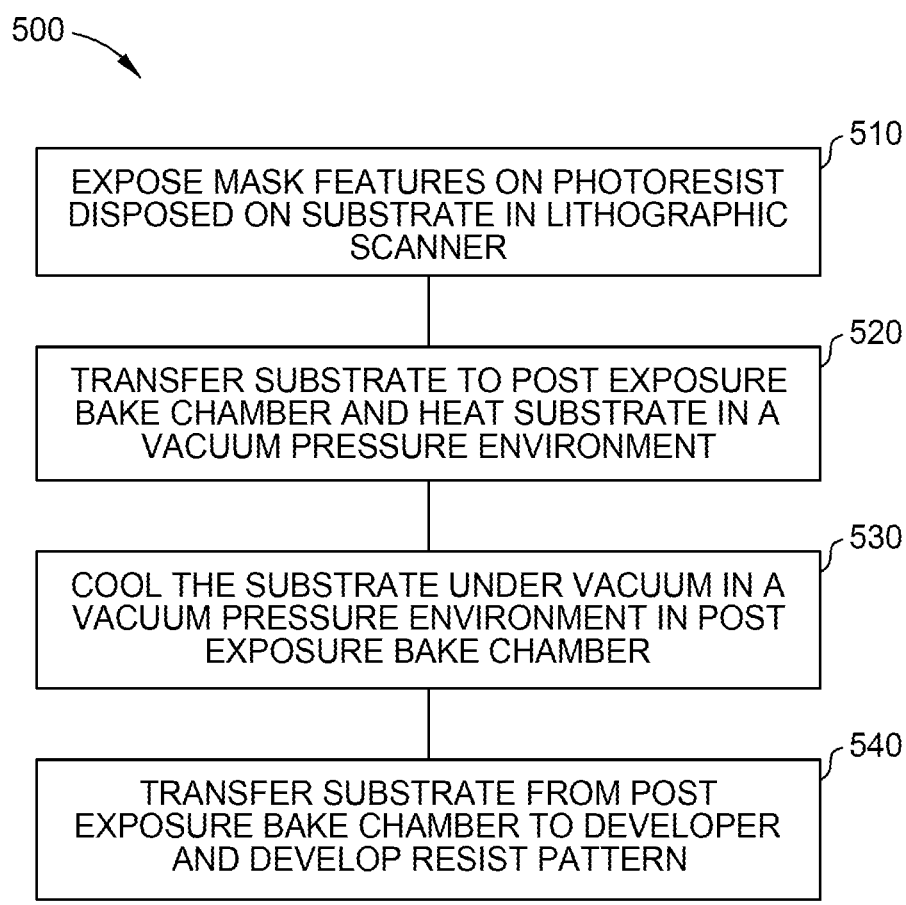
FIG. 5 illustrates operations of a method for baking a substrate in a vacuum pressure environment, according to one embodiment.

FIG. 5 illustrates operations of a method 500 for baking a substrate in a vacuum pressure environment, according to one embodiment. At operation 510, mask features are exposed on photoresist disposed on a substrate in a lithographic scanner. The lithographic exposure process may be performed at ambient pressures or under vacuum pressure depending upon the type of exposure process utilized. At operation 520, the substrate is transferred to a post exposure bake chamber and placed on a substrate support. The process volume in the post exposure bake chamber brought to a sub-atmospheric pressure and the substrate is heated in a vacuum pressure environment. In embodiments where the substrate is maintained at sub-atmospheric pressure while being transferred between the lithographic exposure process to the post exposure bake chamber, the post exposure bake chamber maintains the sub-atmospheric pressure. Examples of substrate bake parameters in a vacuum pressure environment are described with respect to FIG. 3.

At operation 530, the substrate 150 is cooled in the post exposure bake chamber while on the substrate support. For example, with reference to FIG. 2A, the substrate 150 is in the process chamber 100 where the substrate 150 is positioned on the substrate support 130. In some embodiments, refrigerant is circulated through the refrigerant lines 281 within the substrate support 130 to facilitate cooling of the substrate 150 after the bake process performed in the process chamber 100. In other embodiments, the substrate is allowed to cool without the use of refrigerant. In other words, the heating devices 228 in the process chamber 100 stop receiving power and the substrate 150 cools as the process chamber 100 cools. In some embodiments, at least operations 520, 530, and 540 are all done, and the substrate stays, at sub-atmospheric pressure. At operation 540, the substrate is transferred from process chamber 100 to a developer and the photoresist pattern is developed. In one embodiment, the substrate is transferred back to a lithography track apparatus and a wet development process is performed at ambient pressures to further develop the resist. In some embodiments, in reference to FIG. 2B, the substrate 150 is in the process chamber 100 where the substrate 150 is positioned on the substrate support 130. In some embodiments, the substrate 150 is raised from the substrate support 130 to stop transfer of residual heat from the substrate support 130 to the substrate 150. While raised, refrigerant is circulated through the integrated channels 267 within the cooling plate 265 to facilitate cooling of the substrate 150 after the bake process performed in the process chamber 100. In some embodiments, during operation 530, the substrate 150 is under vacuum but an inert gas is still disposed in the process volume 170.

By performing cooling in-situ, the cooling can be performed much faster when compared to conventional processes where the substrate 150 is transported for a long distance or allowed to passively cool. Rapidly cooling the substrate 150 is enhanced by the active cooling of flowing refrigerant into cooling plate 265 while remaining in the process chamber 100. A method and apparatus for rapidly cooling the substrate 150.

Figure 6:
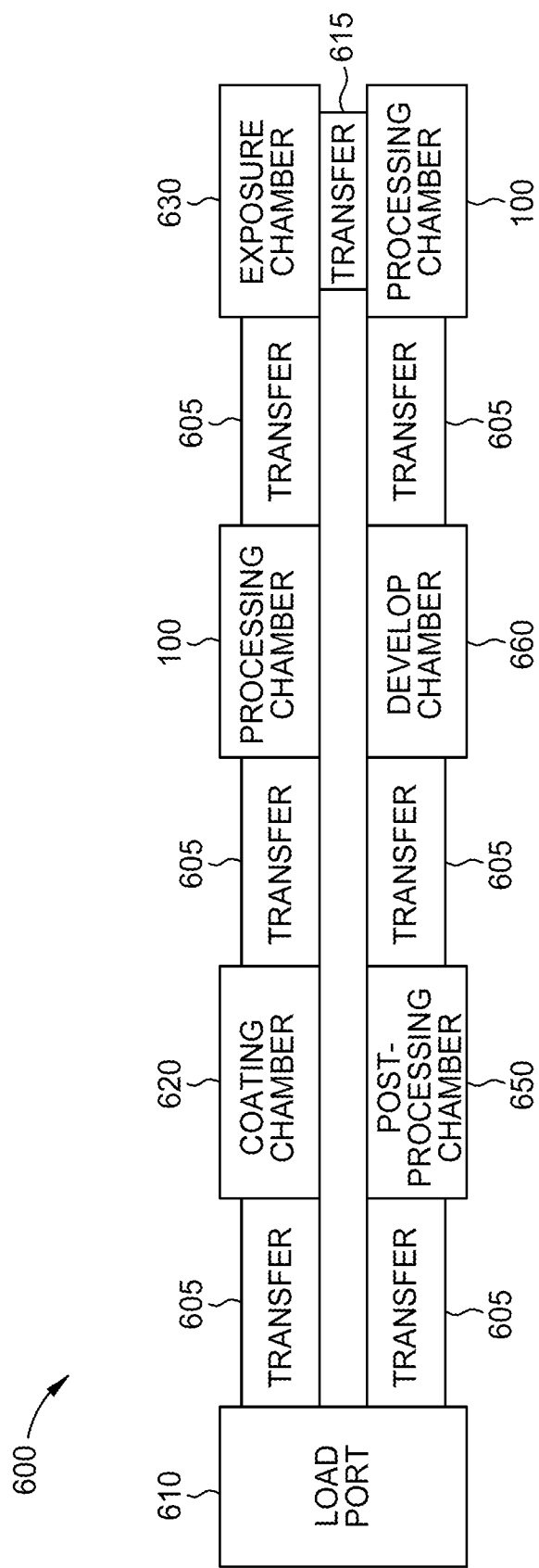
FIG. 6 illustrates a substrate processing system, according to one embodiment.

FIG. 6 illustrates one representative processing system that may be used to process a substrate according to embodiments disclosed herein. As shown, a processing system 600 includes a load port 610, a coating chamber 620, a processing chamber 100, an exposure chamber 630 (such as a scanner), a second processing chamber 100, a development chamber 660, and a post-process chamber 650. Each chamber of the processing system 600 is coupled to each adjacent chamber by a transfer chamber 605 or a transfer chamber 615. The transfer chambers 605 and the transfer chamber 615 may be substantially similar or different. The processing system 600 may be under vacuum. In some embodiments, one or more of the chambers 100, 605, 615, 620, 630, 650, 660 are all under vacuum such that when the substrate is transferred between the chamber 100, 605, 615, 620, 630, 650, 660, the substrate is always under vacuum.

The load port 610 may be used to introduce or remove substrates into or out of the processing system 600. The coating chamber 620 may be used, for example, for applying a photoresist to a substrate. The coating chamber 620 may be, for example, a spin coater. The exposure chamber 630 includes a lithographic scanner and may be used for exposing the substrate to extreme ultraviolet (EUV) light under vacuum in order to form a latent acid image in a photoresist layer on a substrate. The processing chamber 100 is the chamber previously described.

The development chamber 660 may be used, for example, for removing portions of the photoresist layer. The development chamber 660 may be a wet development chamber, a dry development chamber. The development chamber 660 may develop the photoresist at a temperature between about 15° C. to about 30° C. and at atmospheric pressure or at sub-atmospheric pressure. For example, a wet development may occur at about 0.5 torr to about 760 torr. For example, a wet development may occur between 100 torr to about 700 torr. In yet another example, a wet development may occur less than 750 torr.

The post-process chamber 650 may be used, for example, to perform a variety of post-processing steps on a substrate. In some embodiments the post-process chamber 650 may be the same as the processing chamber 100. The processing chamber 100 may be used for a pre-exposure bake, a post-exposure bake, a pre-development bake, a post-development bake, and/or other processing steps.

Figure 7:
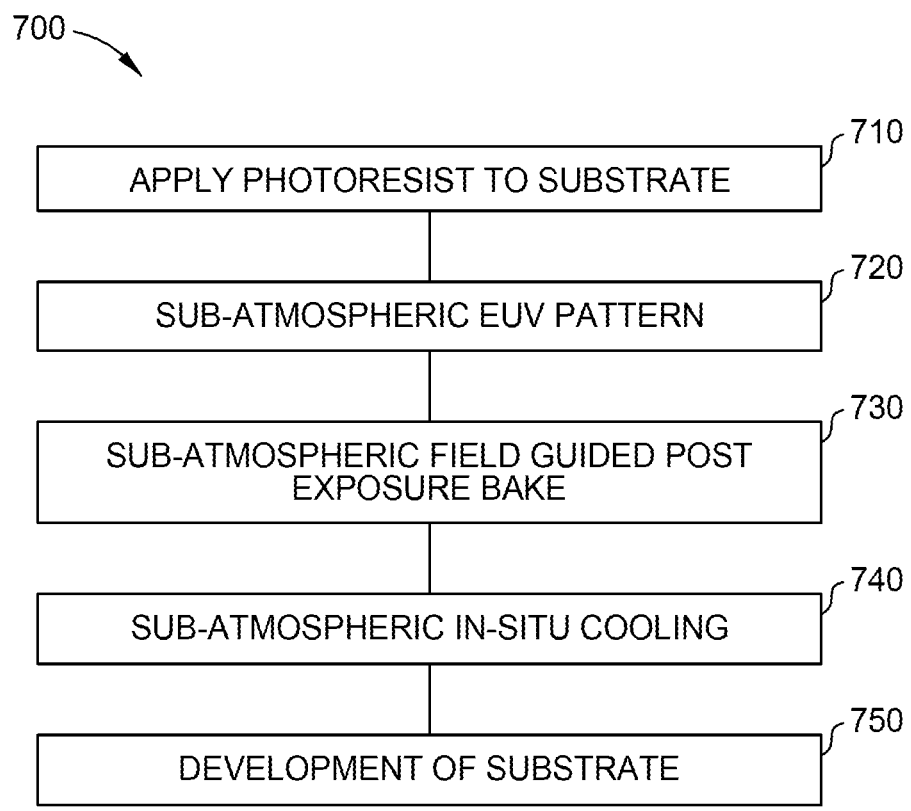
FIG. 7 illustrates operations of a method for processing a substrate in a vacuum pressure environment, according to one embodiment To facilitate understanding, identical reference numerals have been used, where possible, to designate identical elements that are common to the figures. It is contemplated that elements and features of one embodiment may be beneficially incorporated in other embodiments without further recitation.

FIG. 7 illustrates operations of a method 700 for processing a substrate in a vacuum pressure environment, according to one embodiment. At operation 710, a substrate is loaded into a processing system 600 and a photoresist is applied the substrate by a coating chamber 620. The photoresist can be applied by a spin-on process, for example a wet spin on process.

At operation 720, the substrate is transferred to the exposure chamber 630 and exposed to a EUV process to pattern the photoresist on the substrate. The lithographic exposure process may be performed at ambient pressures or under vacuum pressure depending upon the type of exposure process utilized. For example, the lithographic exposure may be a 193 nm lithography process. The EUV process is performed at a temperature between about 15° C. to about 30° C. and under a vacuum. For example the EUV process occurs at about 0.5 torr to about 760 torr. For example between 100 torr to about 700 torr. In yet another example, less than 750 torr.

At operation 730, the substrate is transferred to the process chamber 100/100b and the previously described post exposure bake method 400/500 is performed. The substrate is maintained at sub-atmospheric pressure while being transferred between the lithographic exposure process to the process chamber 100/100b and the post exposure bake chamber maintains the sub-atmospheric pressure. The process volume in the process chamber 100/100b and the substrate are heated in a vacuum pressure environment during the bake operation. Examples of substrate bake parameters in a vacuum pressure environment are described above.

At operation 740, the substrate 150 is cooled in the process chamber 100/100b. For example, with reference to FIG. 2B, the substrate 150 is rapidly cooled in-situ while the substrate 150 is raised from the substrate support 130 and positioned near the cooling plate 265. In some embodiments, refrigerant is circulated through the integrated channels 267 within the cooling plate 265 to facilitate cooling of the substrate 150 after the bake process performed in the process chamber 100. In some embodiments, at least operations 720, 730, and 740 are all done, and the substrate stays, at sub-atmospheric pressure. In some embodiments, as described in FIG. 3, the substrate is moved to a specific cooling chamber so that another substrate can be processed.

At operation 750, the substrate is transferred from process chamber 100/100b to a developer chamber 660 and the photoresist pattern is developed. In one embodiment, the substrate is transferred back to a lithography track apparatus and a wet development process is performed at ambient pressures to further develop the resist.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   exposing photoresist disposed on a substrate to electromagnetic energy;
   transferring the substrate onto a substrate support disposed in a process chamber;
   baking the substrate, on the substrate support, in a first vacuum environment at sub-atmospheric pressure; and
   cooling the substrate to a temperature of 30° C. or below in a second vacuum environment at a second sub-atmospheric pressure by raising the substrate off the substrate support and toward a cooling plate.

2. The method of claim 1, wherein the first sub-atmospheric pressure is between about 0.5 Torr and about 100 Torr.

3. The method of claim 2, wherein the first sub-atmospheric pressure is constant during the baking.

4. The method of claim 2, wherein the first sub-atmospheric pressure is varied during the baking.

5. The method of claim 1, wherein the substrate is heated to a temperature between about 50° C. and about 250° C. during the baking.

6. The method of claim 1, wherein the cooling is performed in a different chamber than the process chamber.

7. The method of claim 6, wherein the second sub-atmospheric pressure is between about 0.5 Torr and about 100 Torr.

8. The method of claim 7, wherein the second sub-atmospheric pressure is constant during cooling of the substrate.

9. The method of claim 7, wherein the second sub-atmospheric pressure is varied during cooling of the substrate.

10. The method of claim 1, wherein the baking the substrate is performed without application or generation of an electric current or electric field to the photoresist.

11. A substrate processing method, comprising:
    exposing a chemically amplified photoresist disposed on a substrate to a lithographic exposure process at sub-atmospheric pressure;
    transferring the substrate onto a substrate support disposed in a process chamber having a process volume;
    baking the substrate in a vacuum environment at a sub-atmospheric pressure in the process volume; and
    cooling the substrate to a temperature of 30° C. or below at the sub-atmospheric pressure in the process volume of the process chamber by raising the substrate off the substrate support and toward a cooling plate.

12. The method of claim 11, wherein the sub-atmospheric pressure is between about 1 Torr and about 55 Torr.

13. The method of claim 11, wherein the substrate is heated to a temperature between about 90° C. and about 135° C. during the baking.

14. The method of claim 11, wherein the substrate stays at the sub-atmospheric pressure during the exposing, transferring, baking, and cooling.

15. The method of claim 11, wherein cooling the substrate further comprises raising the substrate proximate to a cooling plate.

16. The method of claim 15, wherein the substrate is less than 10 millimeters from the cooling plate.

17. A substrate processing method, comprising:
applying a photoresist to a substrate in a coating chamber;
transferring the substrate to an exposure chamber and performing an EUV exposure process under vacuum;
transferring the substrate onto a substrate support in a process chamber having a process volume;
baking the substrate, on the substrate support, at sub-atmospheric pressure in the process volume;
cooling the substrate, by raising the substrate toward a cooling plate opposite the substrate support, to below 30° C. in the process volume of the process chamber at a pressure below 100 Torr; and
transferring the substrate from the process chamber to a developer and developing the photoresist.

18. The method of claim 17, wherein the substrate is heated to a temperature between about 90° C. and about 135° C. during the baking.

19. The method of claim 17, wherein the sub-atmospheric pressure is maintained between the exposing and the baking of the substrate.

20. The method of claim 17, wherein cooling the substrate is performed at a pressure lower than a pressure during the baking.

* * * * *